US008630516B2

(12) United States Patent
Yamada et al.

(10) Patent No.: US 8,630,516 B2
(45) Date of Patent: Jan. 14, 2014

(54) SEMICONDUCTOR OPTICAL FUNCTION DEVICE

(75) Inventors: Koji Yamada, Tokyo (JP); Munechika Kubota, Tokyo (JP); Tomonori Shimamura, Tokyo (JP)

(73) Assignee: NeoPhotonics Semiconductor Godo Kaisha, Tokyo (JP)

( * ) Notice: Subject to any disclaimer, the term of this patent is extended or adjusted under 35 U.S.C. 154(b) by 371 days.

(21) Appl. No.: 12/556,083

(22) Filed: Sep. 9, 2009

(65) Prior Publication Data

US 2010/0080506 A1 Apr. 1, 2010

(30) Foreign Application Priority Data

Sep. 26, 2008 (JP) ................................. 2008-247954

(51) Int. Cl.
*G02B 6/12* (2006.01)
(52) U.S. Cl.
USPC .......................................................... 385/14
(58) Field of Classification Search
USPC .......................................................... 385/14
See application file for complete search history.

(56) References Cited

U.S. PATENT DOCUMENTS 6,678,302 B2 * 1/2004 Nakamura .................. 372/50.1
6,834,152 B2 * 12/2004 Gunn et al. .................... 385/130
6,882,762 B2 * 4/2005 Brist et al. ...................... 385/14
2008/0138008 A1 * 6/2008 Tolstikhin et al. .............. 385/14
2010/0080506 A1 * 4/2010 Yamada et al. .................. 385/14

FOREIGN PATENT DOCUMENTS

JP 03-030488 A 2/1991
JP 05-027130 2/1993
JP 06-075130 3/1994
JP 2001-117058 A 4/2001
JP 2005-327783 A 11/2005

OTHER PUBLICATIONS

H. Debregeas-Sillard et al. "Wide range of operating conditions for a 1000 km-2.5 Gb/s transmission with a new WDM optimized design for integrated laser-electroabsorption modulator", Optical Fiber Communication 1999, WH1-1, pp. 128-130.

* cited by examiner

*Primary Examiner* — Michelle R Connelly
*Assistant Examiner* — Hoang Tran
(74) *Attorney, Agent, or Firm* — Kubotera & Associates, LLC

(57) ABSTRACT

A semiconductor optical function device includes a semiconductor substrate having a substrate edge surface; an optical waveguide formed on the semiconductor substrate; a non-waveguide region formed on the semiconductor substrate between the optical waveguide and the substrate edge surface; and an insulation region disposed around the optical waveguide and having a semiconductor interface contacting with the non-waveguide region on a side of the substrate edge surface. The semiconductor interface extends not in parallel to the substrate edge surface, and is inclined relative to the substrate edge surface by a specific angle.

4 Claims, 12 Drawing Sheets

SEMICONDUCTOR OPTICAL FUNCTION DEVICE

BACKGROUND OF THE INVENTION AND RELATED ART STATEMENT

The present invention relates to a semiconductor optical function device. More specifically, the present invention relates to a semiconductor optical function device having a semiconductor optical waveguide.

FIG. 1 is a schematic perspective view showing a configuration of a conventional semiconductor optical function device 10. FIG. 2 is a schematic sectional view showing the conventional semiconductor optical function device 10 taken along a line 2-2 in FIG. 1. FIG. 3 is a schematic view showing the conventional semiconductor optical function device 10 in an operational state.

As shown in FIG. 1, the conventional semiconductor optical function device 10 includes an optical waveguide 28. The optical waveguide 28 has a recess portion with a semiconductor structure extending in a lateral direction thereof, and insulation layers 26 are formed in the recess portion. A non-waveguide region 29 without a recess portion is disposed at an end portion of the optical waveguide 28. The non-waveguide region 29 continuously extends outside the insulation layers 26. The non-waveguide region 29 has a semiconductor interface 32 extending in parallel to a substrate edge surface 30 on a side corresponding to the substrate edge surface 30.

When the conventional semiconductor optical function device 10 is produced, first, a first conductive type lower clad layer (formed of n-InP) 15, a core layer (formed of InGaAsP) 16, a second conductive type upper clad layer (formed of P-InP) 18, and a second conductive type contact layer (formed of $P^+$-InGaAs) 20 are grown as crystal phases on a first conductive type substrate (formed of n-InP) 14. A total thickness of the second conductive type upper clad layer 18 and the second conductive type contact layer 20 is, for example, 2 μm.

In the next step, grooves (to be the insulation layers 26) are formed in both sides of a light passing portion (to be the optical waveguide 28) through a lithography technology. Afterward, a passivation film (formed of $SiO_2$ or SiN) 22 is formed on the second conductive type contact layer 20 or a semiconductor layer. A mask pattern is designed in advance such that the grooves are not formed in the non-waveguide region 29 when the grooves are formed through the lithography technology. The grooves (to be the insulation layers 26) have a depth of about 2 μm corresponding to the total thickness of the second conductive type upper clad layer 18 and the second conductive type contact layer 20.

In the next step, an electrically insulation material (to be the insulation layers 26) such as an organic insulation film (formed of, for example, polyimide) is filled in the grooves (to be the insulation layers 26) and is flattened. Afterward, a second electrode (anode) 24 is formed on the passivation film 22. Further, a backside surface of the first conductive type substrate 14 is polished to have an appropriate thickness (normally, about 100 m), and a first electrode (cathode) 12 is formed on the backside surface thus polished. Afterward, the conventional semiconductor optical function device 10 is cut in an appropriate chip size. Note that an appropriate reflection film is formed on a cut edge surface (an outer side surface). For example, in a semiconductor optical amplifier, a non-reflection film is formed on an edge surface.

When the conventional semiconductor optical function device 10 having the optical waveguide 28 is in an operational state, residual reflection at the end portion of the optical waveguide 28 may generate light passing in a reverse direction (reverse light) as shown in FIG. 3. When the reverse light is generated, a function of the conventional semiconductor optical function device 10 may be interfered. A semiconductor optical modulator or a function element with an integrated semiconductor optical modulator (a semiconductor device) tends to be especially susceptible to the reverse light.

In the semiconductor optical amplifier, the residual reflection at an end portion of an optical waveguide may cause a resonance effect. In this case, a cyclic optical amplification gain corresponding to an optical length of the semiconductor optical amplifier becomes non-flat. The non-flatness of the optical amplification gain causes a large variance in a characteristic of an individual element, thereby lowering yield of a manufacturing process of the element. Further, the optical amplification gain tends to fluctuate in response to a subtle difference in a wavelength or a temperature, thereby causing instability in an optical system.

For example, in a semiconductor device, in which a semiconductor optical modulator and a semiconductor laser are integrated on a single substrate, laser light is continuously generated or oscillated in a semiconductor laser region and modulated in a semiconductor optical modulator region. Afterward, the laser light reaches an end portion of an optical waveguide.

At this moment, when the residual reflection occurs at the end portion of the optical waveguide, the reverse light is generated. The reverse light passes through the semiconductor optical modulator region and returns to the semiconductor laser region. Eventually, the residual light becomes a seed in the semiconductor laser region, thereby making the continuous oscillation state of the laser light unstable.

Further, a variance in a characteristic of an individual element becomes large, thereby lowering yield of a manufacturing process of the element. Further, a modulation response property tends to vary in response to a current of the semiconductor laser, thereby causing instability in an optical system.

In order to solve the problem described above, Non-Patent Reference has disclosed two countermeasures for reducing an amount of the reverse light. In the first one of the countermeasures, an optical waveguide has a curved shape with a specific curvature. In the second one of the countermeasures, a region having a width greater than that of the optical waveguide (a wide width end portion region) is disposed at the end portion of the optical waveguide. Accordingly, it is possible to prevent the reverse light generated at the end portion of the optical waveguide from returning to the optical waveguide.

Non-Patent Reference: "Wide range of operating conditions for a 1000 Km-2.5 Gb/s transmission with a new WDM optimized design for integrated laser-electroabsorption modulator", Optical Fiber Communication 1999, WH1-1

In the conventional method disclosed in Non-Patent Reference, the reverse light itself generates multiple reflections at the wide width end portion region. A large portion of reflected light irradiates externally, thereby deteriorating quality of signal light.

According to Patent Reference 1, an optical waveguide has an edge surface disposed inside an edge surface of a substrate. Accordingly, it is possible to reduce an amount of reflected light from the edge surface of the substrate to a light source.

Patent Reference 1: Japanese Patent Publication No. 06-075130

According to Patent Reference 2, an optical waveguide has an edge surface disposed in an inclined state relative to an interface. Accordingly, it is possible to reduce an influence of reflected light on a light source.

Patent Reference 2: Japanese Patent Publication No. 05-027130

In the conventional technologies described above, however, efficiencies thereof are not sufficient, and it is difficult to effectively reduce the internal reflection due to the residual reflection at the end portion of the optical waveguide.

In view of the problems described above, an object of the present invention is to provide a semiconductor optical function device capable of solving the problems of the conventional semiconductor optical function device. In the present invention, it is possible to sufficiently reduce internal reflection due to residual reflection at an end portion of an optical waveguide.

Further objects and advantages of the invention will be apparent from the following description of the invention.

SUMMARY OF THE INVENTION

In order to attain the objects described above, according to the present invention, a semiconductor optical function device includes a semiconductor substrate having a substrate edge surface; an optical waveguide formed on the semiconductor substrate; a non-waveguide region formed on the semiconductor substrate between the optical waveguide and the substrate edge surface; and an insulation region disposed around the optical waveguide and having a semiconductor interface contacting with the non-waveguide region on a side of the substrate edge surface. The semiconductor interface extends not in parallel to the substrate edge surface, and is inclined relative to the substrate edge surface by a specific angle.

In the present invention, the semiconductor interface extends not in parallel to the substrate edge surface, and is inclined relative to the substrate edge surface by the specific angle. In other words, the semiconductor interface and the substrate edge surface do not extend in parallel to with each other. Further, the semiconductor interface is inclined relative to the substrate edge surface by the specific angle.

As described above, in the present invention, the semiconductor interface of the non-waveguide region extends not in parallel to the substrate edge surface, and is inclined relative to the substrate edge surface by the specific angle (formed in an inclined state). Accordingly, it is possible to prevent reverse light from irradiating into the optical waveguide.

When light irradiates from the substrate edge surface to the semiconductor interface, a specific amount of passing light exists (light passing into the non-waveguide region through the semiconductor interface). Accordingly, an angle of the semiconductor interface is adjusted such that light irradiating from the substrate edge surface to the semiconductor interface is completely reflected at the semiconductor interface. As a result, it is possible to effectively reduce internal reflection due to edge surface residual reflection at an end portion of the optical waveguide.

DETAILED DESCRIPTION OF PREFERRED EMBODIMENTS

Hereunder, embodiments of the present invention will be explained with reference to the accompanying drawings.

First Embodiment

Figure 1:
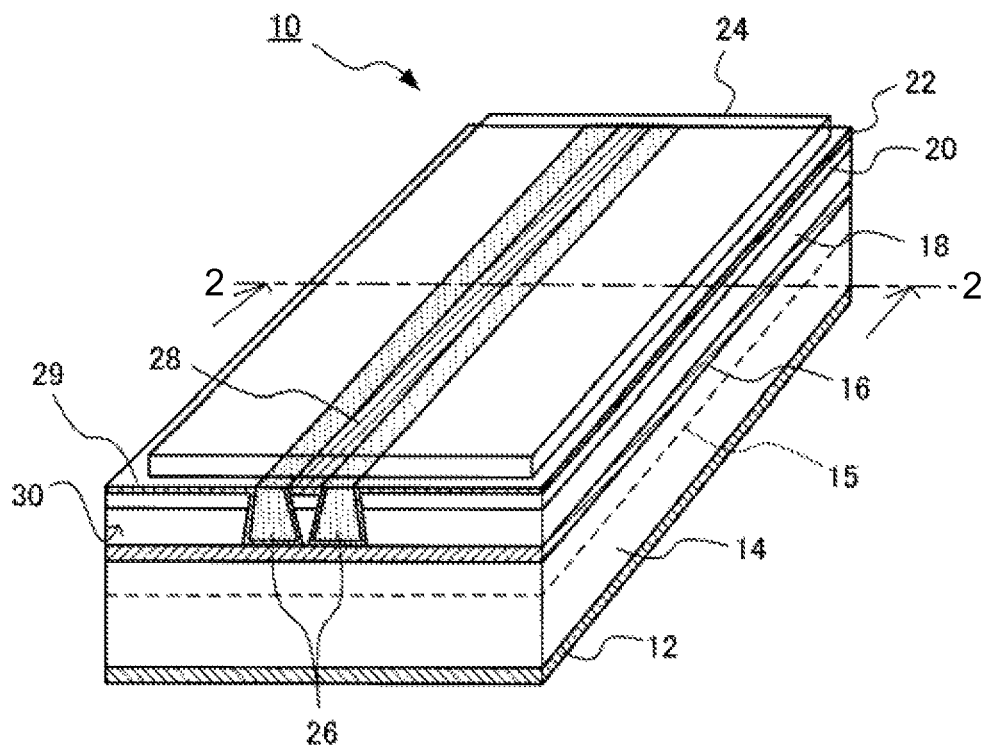
FIG. 1 is a schematic perspective view showing a configuration of a conventional semiconductor optical function device.
Figure 2:
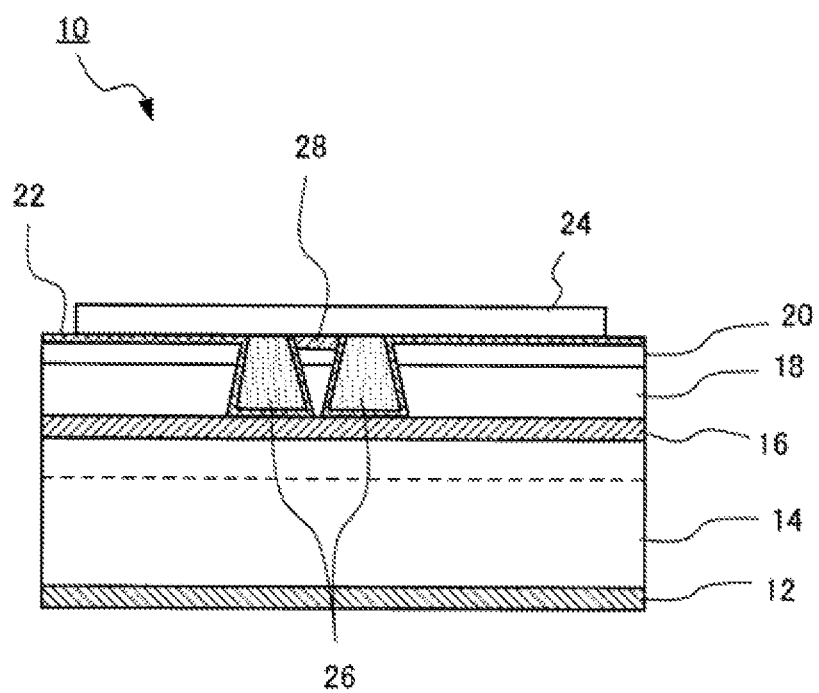
FIG. 2 is a schematic sectional view showing the conventional semiconductor optical function device taken along a line 2-2 in FIG. 1.
Figure 3:
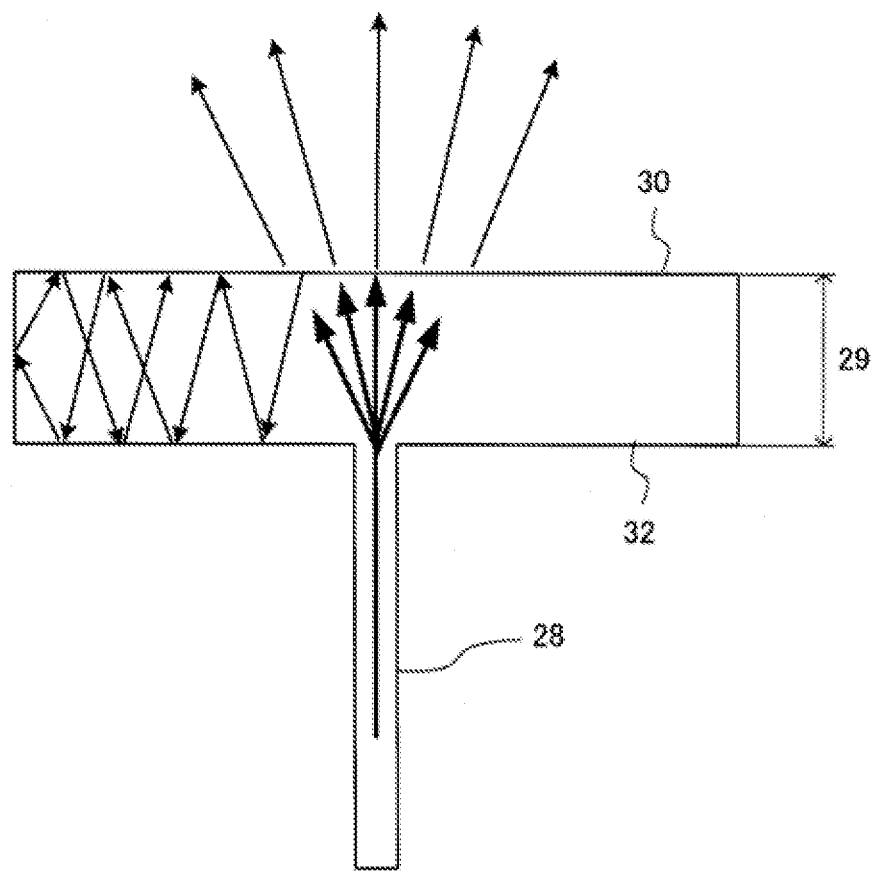
FIG. 3 is a schematic view showing the conventional semiconductor optical function device in an operational state.
Figure 4:
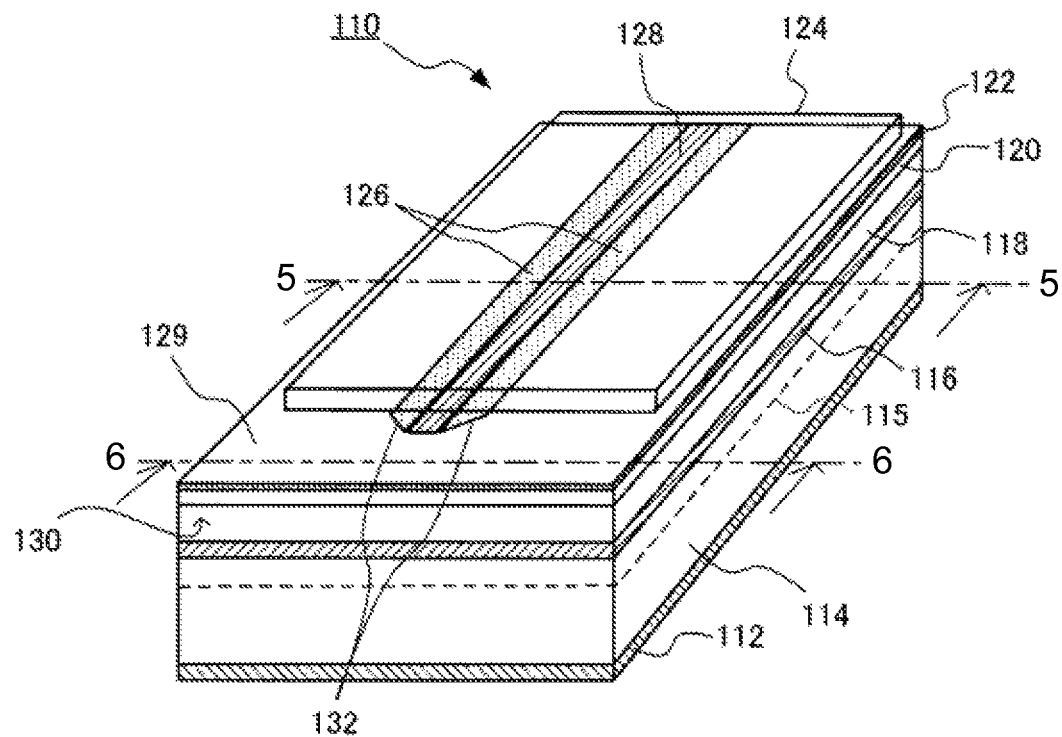
FIG. 4 is a schematic perspective view showing a configuration of a semiconductor optical function device according to a first embodiment of the present invention.
Figure 5:
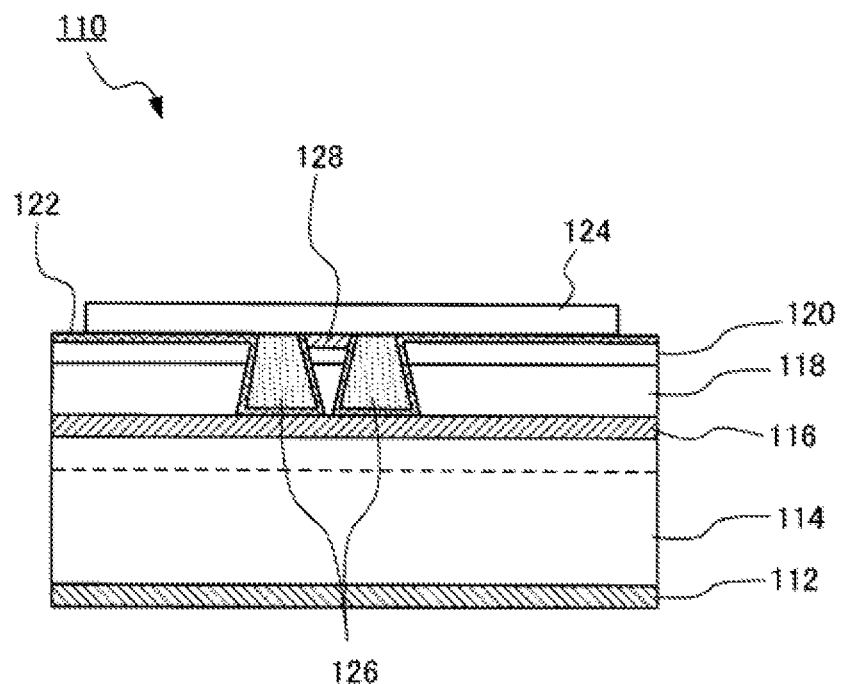
FIG. 5 is a schematic sectional view showing the semiconductor optical function device taken along a line 5-5 in FIG. 4 according to the first embodiment of the present invention.
Figure 6:
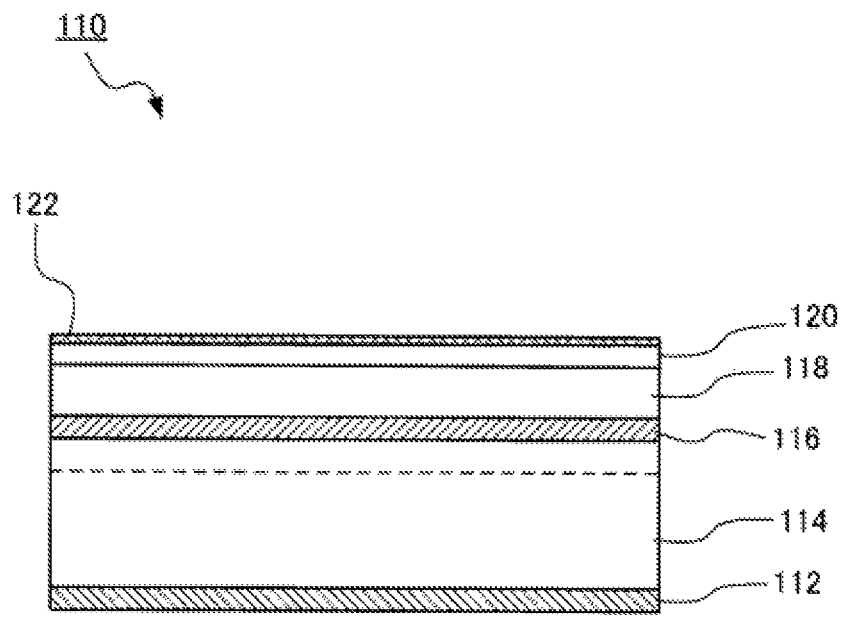
FIG. 6 is a schematic sectional view showing the semiconductor optical function device taken along a line 6-6 in FIG. 4 according to the first embodiment of the present invention.

A first embodiment of the present invention will be explained. FIG. 4 is a schematic perspective view showing a configuration of a semiconductor optical function device 110 according to the first embodiment of the present invention. FIG. 5 is a schematic sectional view showing the semiconductor optical function device 110 taken along a line 5-5 in FIG. 4 according to the first embodiment of the present invention. FIG. 6 is a schematic sectional view showing the semiconductor optical function device 110 taken along a line 6-6 in FIG. 4 according to the first embodiment of the present invention.

As shown in FIG. 4, the semiconductor optical function device 110 of an optical waveguide type includes an optical waveguide 128. The optical waveguide 128 has a recess portion with a semiconductor structure extending in a lateral direction thereof, and insulation layers 126 are formed in the recess portion. A non-waveguide region 129 without a recess portion is disposed at an end portion of the optical waveguide 128. The non-waveguide region 129 continuously extends outside the insulation layers 126.

In the embodiment, in the non-waveguide region 129, the insulation layers 126 have semiconductor interfaces 132 as edge surfaces on a side of a substrate edge surface 130. The semiconductor interfaces 132 are inclined away from the substrate edge surface 130 toward an opposite side of the optical waveguide 128. The semiconductor interfaces 132 are inclined by an inclination angle (Z) of about 5 degrees to 60 degrees.

When the semiconductor optical function device 110 is produced, first, a first conductive type lower clad layer (formed of n-InP) 115, a core layer (formed of InGaAsP) 116, a second conductive type upper clad layer (formed of P-InP) 118, and a second conductive type contact layer (formed of P$^+$-InGaAs) 120 are grown as crystal phases on a first conductive type substrate (formed of n-InP) 114. A total thickness of the second conductive type upper clad layer 118 and the second conductive type contact layer 120 is, for example, 2 μm.

In the next step, grooves (to be the insulation layers 126) are formed in both sides of a light passing portion (to be the optical waveguide 128) through a lithography technology. Afterward, a passivation film (formed of SiO$_2$ or SiN) 122 is formed on the second conductive type contact layer 120 or a semiconductor layer. A mask pattern is designed in advance such that the grooves are not formed in the non-waveguide region 129 when the grooves are formed through the lithography technology. The grooves (to be the insulation layers 126) have a depth of about 2 μm corresponding to the total thickness of the second conductive type upper clad layer 118 and the second conductive type contact layer 120.

In the next step, an electrically insulation material (to be the insulation layers 126) such as an organic insulation film (formed of, for example, polyimide) is filled in the grooves (to be the insulation layers 126) and is flattened. Afterward, a second electrode (anode) 124 is formed on the passivation film 122. Further, a backside surface of the first conductive type substrate 114 is polished to have an appropriate thickness (normally, about 100 m), and a first electrode (cathode) 112 is formed on the backside surface thus polished. Afterward, the semiconductor optical function device 110 is cut in an appropriate chip size. Note that an appropriate reflection film is formed on a cut edge surface (an outer side surface). For example, in a semiconductor optical amplifier, a non-reflection film is formed on an edge surface.

Second Embodiment

Figure 7:
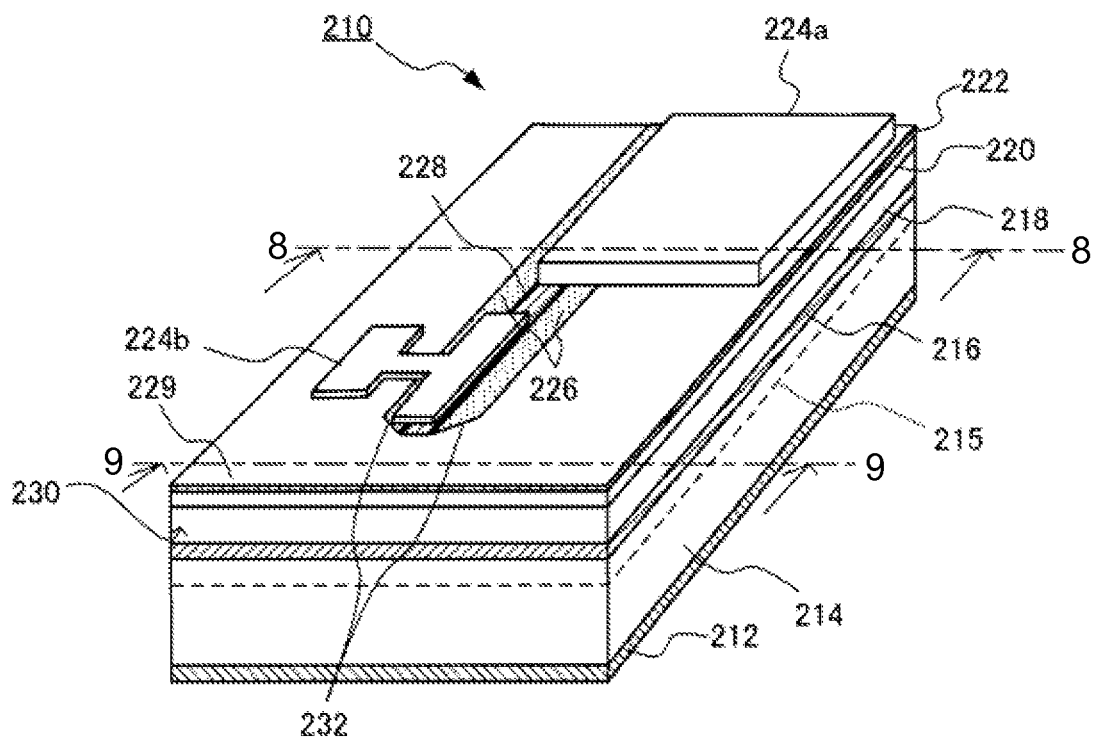
FIG. 7 is a schematic perspective view showing a configuration of a semiconductor optical function device according to a second embodiment of the present invention.
Figure 8:
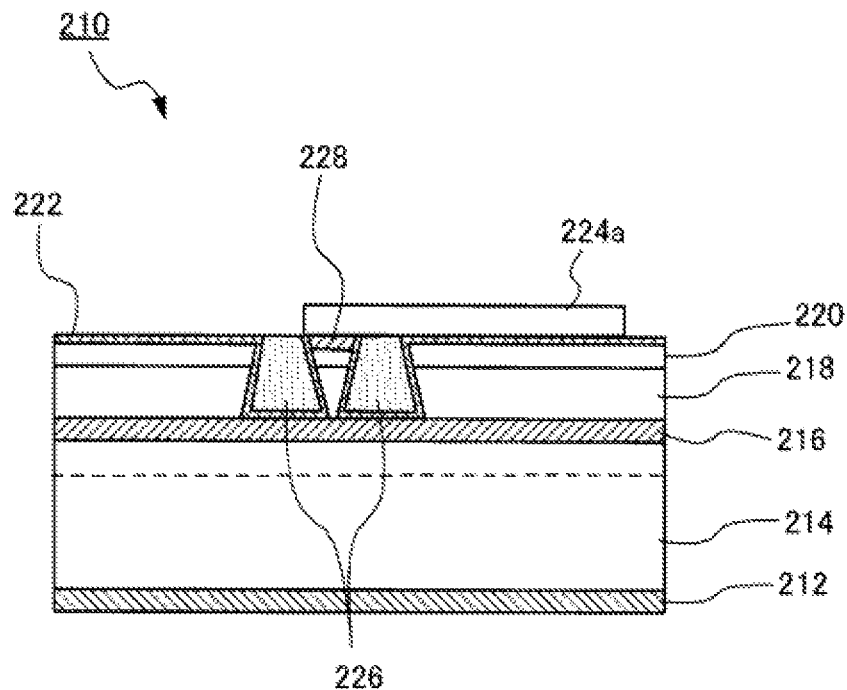
FIG. 8 is a schematic sectional view showing the semiconductor optical function device taken along a line 8-8 in FIG. 7 according to the second embodiment of the present invention.
Figure 9:
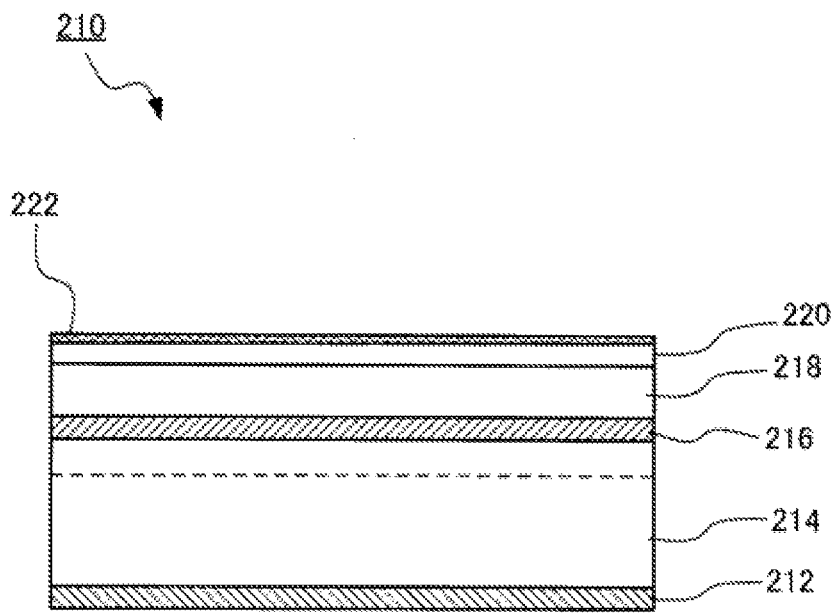
FIG. 9 is a schematic sectional view showing the semiconductor optical function device taken along a line 9-9 in FIG. 7 according to the second embodiment of the present invention.

A second embodiment of the present invention will be explained next. FIG. 7 is a schematic perspective view showing a configuration of a semiconductor optical function device 210 according to the second embodiment of the present invention. FIG. 8 is a schematic sectional view showing the semiconductor optical function device 210 taken along a line 8-8 in FIG. 7 according to the second embodiment of the present invention. FIG. 9 is a schematic sectional view showing the semiconductor optical function device 210 taken along a line 9-9 in FIG. 7 according to the second embodiment of the present invention.

In the embodiment, the semiconductor optical function device 210 includes two semiconductor optical function elements along a direction of an optical waveguide 228, namely a laser diode 224a and a semiconductor optical modulator 224b.

As shown in FIG. 7, the semiconductor optical function device 210 of an optical waveguide type includes the optical waveguide 228. The optical waveguide 228 has a recess portion with a semiconductor structure extending in a lateral direction thereof, and insulation layers 226 are formed in the recess portion. A non-waveguide region 229 without a recess portion is disposed at an end portion of the optical waveguide 228. The non-waveguide region 229 continuously extends outside the insulation layers 226.

In the embodiment, in the non-waveguide region 229, the insulation layers 226 have semiconductor interfaces 232 as edge surfaces on a side of a substrate edge surface 230. The semiconductor interfaces 232 are inclined away from the substrate edge surface 230 toward an opposite side of the optical waveguide 228. The semiconductor interfaces 232 are inclined by an inclination angle (Z) of about 5 degrees to 60 degrees.

When the semiconductor optical function device 210 is produced, first, a first conductive type lower clad layer (formed of n-InP) 215, a core layer (formed of InGaAsP) 216, a second conductive type upper clad layer (formed of P-InP) 218, and a second conductive type contact layer (formed of P$^+$-InGaAs) 220 are grown as crystal phases on a first conductive type substrate (formed of n-InP) 214. A total thickness of the second conductive type upper clad layer 218 and the second conductive type contact layer 220 is, for example, 2 μm.

In the next step, grooves (to be the insulation layers 226) are formed in both sides of a light passing portion (to be the optical waveguide 228) through a lithography technology. Afterward, a passivation film (formed of SiO$_2$ or SiN) 222 is formed on the second conductive type contact layer 220 or a semiconductor layer. A mask pattern is designed in advance such that the grooves are not formed in the non-waveguide region 229 when the grooves are formed through the lithography technology. The grooves (to be the insulation layers 226) have a depth of about 2 μm corresponding to the total thickness of the second conductive type upper clad layer 218 and the second conductive type contact layer 220.

In the next step, an electrically insulation material (to be the insulation layers 226) such as an organic insulation film (formed of, for example, polyimide) is filled in the grooves (to be the insulation layers 226) and is flattened. Afterward, a second electrode (anode) 224 is formed on the passivation film 222. Further, a backside surface of the first conductive type substrate 214 is polished to have an appropriate thickness (normally, about 100 m), and a first electrode (cathode) 212 is formed on the backside surface thus polished. Afterward, the semiconductor optical function device 210 is cut in an appropriate chip size. Note that an appropriate reflection film is formed on a cut edge surface (an outer side surface). For example, in the semiconductor optical amplifier, the non-reflection film is formed on the edge surface.

In the embodiment, a diffracting grating structure (not shown) is formed in the laser diode regions 224a above or below the core layer 216. In general, the core layer 216 in the semiconductor optical modulator 224b is grown as a crystal phase separately from the core layer 216 in the laser diode region 224a. Alternatively, the core layer 216 in the semiconductor optical modulator 224b may be grown concurrently with the core layer 216 in the laser diode region 224a. Note that the non-waveguide region 229 is formed on a side opposite to the laser diode region 224a viewed from the semiconductor optical modulator 224b.

Third Embodiment

Figure 10:
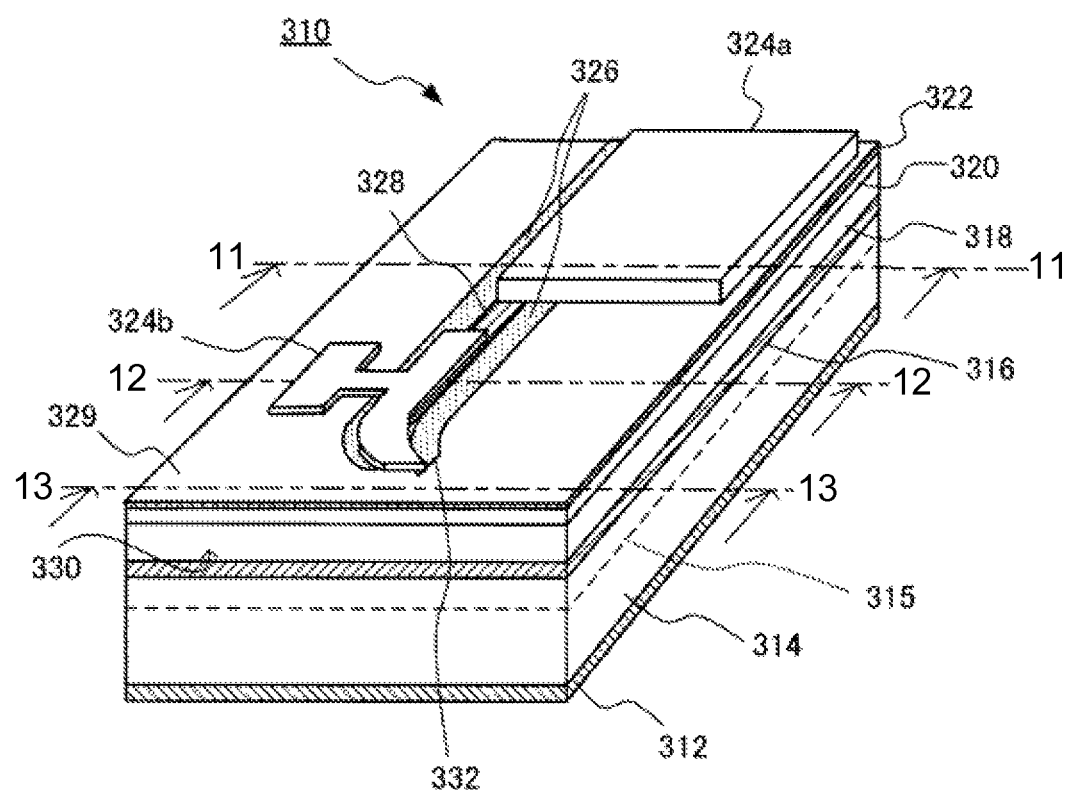
FIG. 10 is a schematic perspective view showing a configuration of a semiconductor optical function device according to a third embodiment of the present invention.

A third embodiment of the present invention will be explained next. FIG. 10 is a schematic perspective view showing a configuration of a semiconductor optical function device 310 according to the third embodiment of the present invention.

Figure 11:
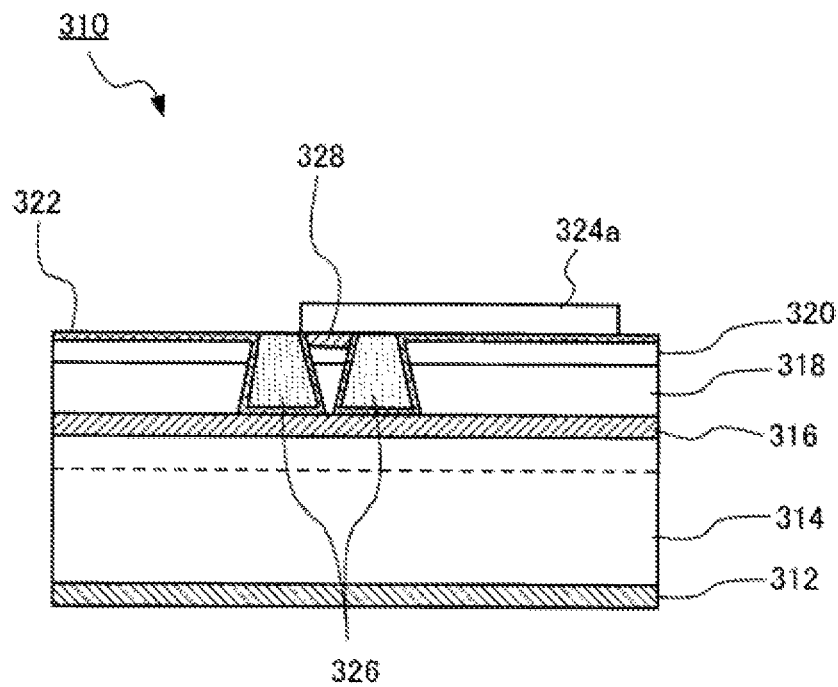
FIG. 11 is a schematic sectional view showing the semiconductor optical function device taken along a line 11-11 in FIG. 10 according to the third embodiment of the present invention.
Figure 12:
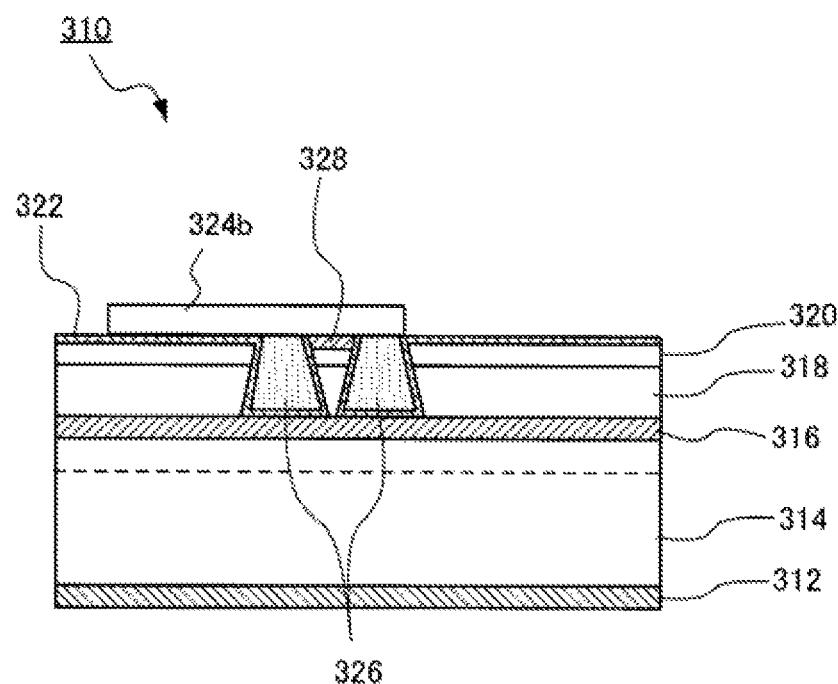
FIG. 12 is a schematic sectional view showing the semiconductor optical function device taken along a line 12-12 in FIG. 10 according to the third embodiment of the present invention.
Figure 13:
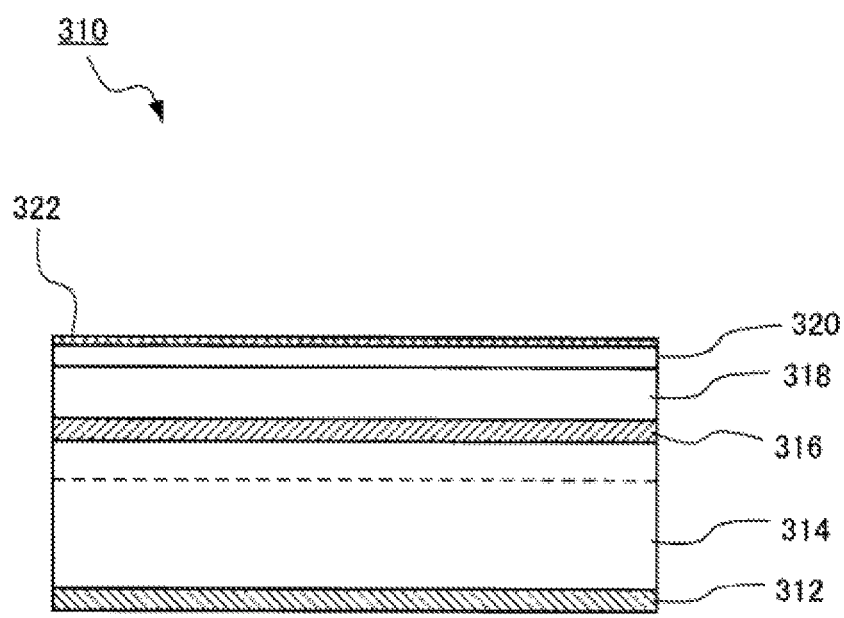
FIG. 13 is a schematic sectional view showing the semiconductor optical function device taken along a line 13-13 in FIG. 10 according to the third embodiment of the present invention.

FIG. 11 is a schematic sectional view showing the semiconductor optical function device 310 taken along a line 11-11 in FIG. 10 according to the third embodiment of the present invention. FIG. 12 is a schematic sectional view showing the semiconductor optical function device 310 taken along a line 12-12 in FIG. 10 according to the third embodiment of the present invention. FIG. 13 is a schematic sectional view showing the semiconductor optical function device 310 taken along a line 13-13 in FIG. 10 according to the third embodiment of the present invention.

In the embodiment, the semiconductor optical function device 310 includes an optical waveguide 328 having a curved shape. Other components in the third embodiment are substantially similar to those in the second embodiment.

More specifically, as shown in FIG. 10, the semiconductor optical function device 310 of an optical waveguide type includes the optical waveguide 328. The optical waveguide 328 has a recess portion with a semiconductor structure extending in a lateral direction thereof, and insulation layers 326 are formed in the recess portion. A non-waveguide region 329 without a recess portion is disposed at an end portion of the optical waveguide 328. The non-waveguide region 329 continuously extends outside the insulation layers 326.

In the embodiment, in the non-waveguide region 329, the insulation layers 326 have semiconductor interfaces 332 as edge surfaces on a side of a substrate edge surface 330. The semiconductor interfaces 332 are inclined away from the substrate edge surface 330 toward an opposite side of the optical waveguide 328. The semiconductor interfaces 332 are inclined by an inclination angle (Z) of about 5 degrees to 60 degrees.

When the semiconductor optical function device 310 is produced, first, a first conductive type lower clad layer (formed of n-InP) 315, a core layer (formed of InGaAsP) 316, a second conductive type upper clad layer (formed of P-InP) 318, and a second conductive type contact layer (formed of P$^+$-InGaAs) 320 are grown as crystal phases on a first conductive type substrate (formed of n-InP) 314. A total thickness of the second conductive type upper clad layer 318 and the second conductive type contact layer 320 is, for example, 2 μm.

In the next step, grooves (to be the insulation layers 326) are formed in both sides of a light passing portion (to be the optical waveguide 328) through a lithography technology. Afterward, a passivation film (formed of SiO$_2$ or SiN) 322 is formed on the second conductive type contact layer 320 or a semiconductor layer. A mask pattern is designed in advance such that the grooves are not formed in the non-waveguide region 329 when the grooves are formed through the lithography technology. The grooves (to be the insulation layers 326) have a depth of about 2 μm corresponding to the total thickness of the second conductive type upper clad layer 318 and the second conductive type contact layer 320.

In the next step, an electrically insulation material (to be the insulation layers 326) such as an organic insulation film (formed of, for example, polyimide) is filled in the grooves (to be the insulation layers 326) and is flattened. Afterward, a second electrode (anode) 324 is formed on the passivation film 322. Further, a backside surface of the first conductive type substrate 214 is polished to have an appropriate thickness (normally, about 100 m), and a first electrode (cathode) 312 is formed on the backside surface thus polished. Afterward, the semiconductor optical function device 310 is cut in an appropriate chip size. Note that an appropriate reflection film is formed on a cut edge surface (an outer side surface). For example, in the semiconductor optical amplifier, the non-reflection film is formed on the edge surface.

In the embodiment, a diffracting grating structure (not shown) is formed in the laser diode regions 324*a* above or below the core layer 316. In general, the core layer 316 in the semiconductor optical modulator 324*b* is grown as a crystal phase separately from the core layer 216 in the laser diode region 324*a*. Alternatively, the core layer 316 in the semiconductor optical modulator 324*b* may be grown concurrently with the core layer 316 in the laser diode region 324*a*. Note that the non-waveguide region 329 is formed on a side opposite to the laser diode region 324*a* viewed from the semiconductor optical modulator 324*b*.

As described above, in the embodiment, the semiconductor optical function device 310 includes the optical waveguide 328 having the curved shape. Accordingly, it is possible to easily incline the semiconductor interfaces 332 by a large angle with respect to the substrate edge surface 330.

Figure 14:
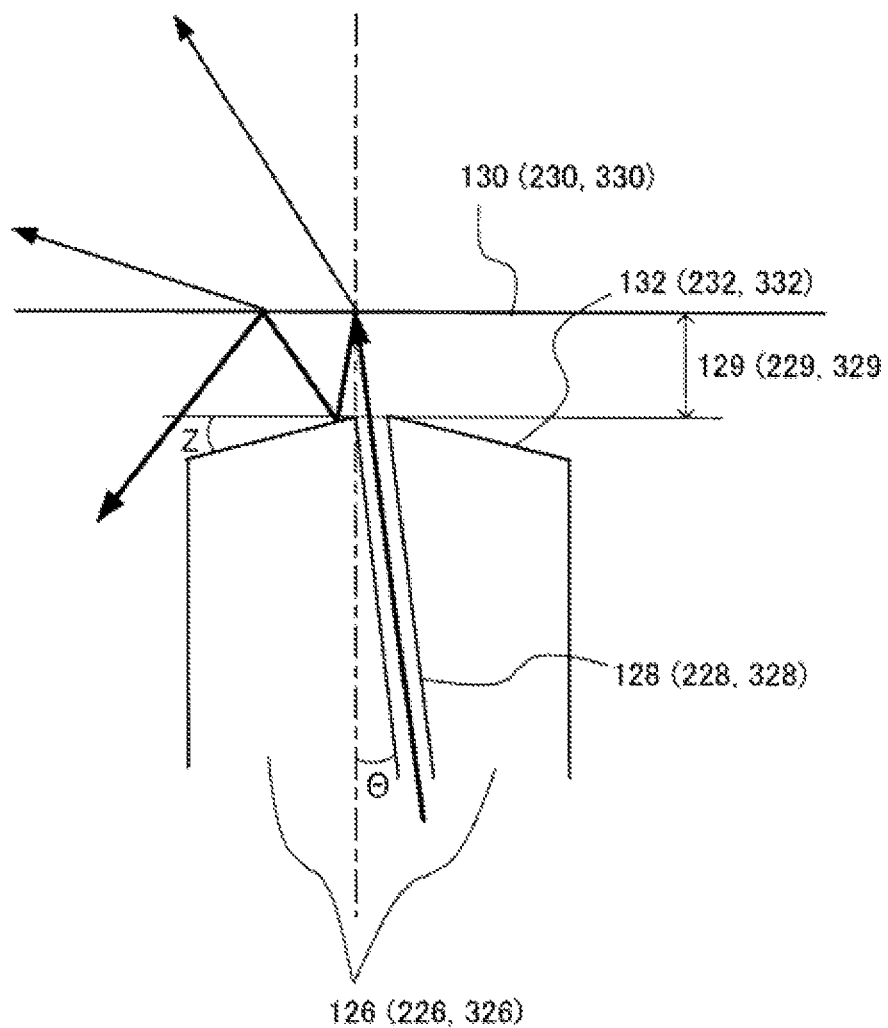
FIG. 14 is a schematic view No. 1 showing the semiconductor optical function device in an operational state according to the present invention.

An effect of the embodiments described above will be described next. FIG. 14 is a schematic view No. 1 showing the semiconductor optical function device 110 (or 210, 310) in an operational state according to the present invention.

As shown in FIG. 14, when light is incident on the non-waveguide region 129 (or 229, 329), light is reflected on the substrate edge surface 130 (or 230, 330) in a direction significantly away from the optical waveguide 128 (or 228, 328).

As described above, in the embodiments, the semiconductor interface 132 (or 232, 332) is inclined with respect to the substrate edge surface 130 (or 230, 330) by the specific angle Z. Accordingly, a reflection angle of light on the substrate edge surface 130 (or 230, 330) increases regularly according to the number of multiple reflections.

As a result, the reverse light is diffused toward outside the insulation layers 126 (or 226, 326) of the semiconductor optical function device 110 (or 210, 310), and does return to the optical waveguide 128 (or 228, 328). Accordingly, it is possible to prevent the reverse light from affecting a characteristic of the semiconductor optical function device 110 (or 210, 310). Therefore, it is possible to reduce a variance in a characteristic of the semiconductor optical function device 110 (or 210, 310). Further, it is possible to prevent yield of a manufacturing process from decreasing, and to make an optical system using the semiconductor optical function device 110 (or 210, 310) stable.

In the embodiment, the inclination angle Z may be determined according to a distance between the substrate edge surface 130 (or 230, 330) and the semiconductor interface 132 (or 232, 332); an axial angle θ of the optical waveguide 128 (or 228, 328) relative to the substrate edge surface 130 (or 230, 330); a refractive index of the optical waveguide 128 (or 228, 328); and the likes.

For example, when the axial angle θ of the optical waveguide 128 (or 228, 328) relative to the substrate edge surface 130 (or 230, 330) is 6 degrees, the inclination angle Z may be set to 10 degrees. In this case, the reverse light is incident on the substrate edge surface 130 (or 230, 330) by an angle of 26 degrees, so that the reverse light can be greatly diffused away from the optical waveguide 128 (or 228, 328).

Figure 15:
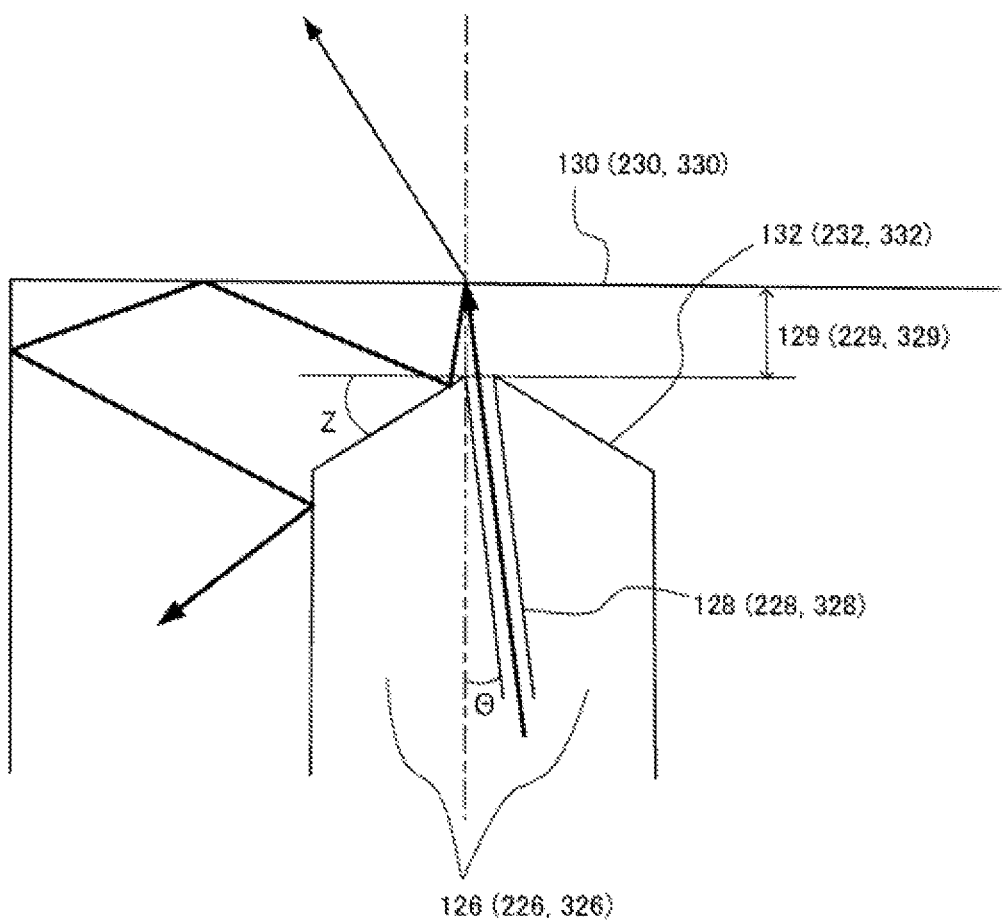
FIG. 15 is a schematic view No. 2 showing the semiconductor optical function device in the operational state according to the present invention.

FIG. 15 is a schematic view No. 2 showing the semiconductor optical function device 110 (or 210, 310) in the operational state according to the present invention.

As shown in FIG. 15, the semiconductor interface 132 (or 232, 332) may be inclined with respect to the substrate edge surface 130 (or 230, 330) by the specific angle Z, so that the reverse light from the optical waveguide 128 (or 228, 328) is completely reflected (total reflection) on the substrate edge surface 130 (or 230, 330). Accordingly, it is possible to further reduce internal reflection due to edge surface reflection at the end portion of the optical waveguide 128 (or 228, 328)

In the embodiments described above, the optical waveguide 128 (or 228, 328) is a ridge type as an example, and may have a structure of a double channel buried hetero type. Further, in addition to a semiconductor laser, in which a semiconductor optical amplifier and a semiconductor optical modulator are integrated on a single substrate, the present invention may be applicable to an optical modulator or an optical switch of an MZ type, a Sagnac type, and a directional coupler type.

The disclosure of Japanese Patent Application No. 2008-247954, filed on Sep. 26, 2008, is incorporated in the application.

While the invention has been explained with reference to the specific embodiments of the invention, the explanation is illustrative and the invention is limited only by the appended claims.

What is claimed is:

1. A semiconductor optical function device, comprising:
a semiconductor substrate having a substrate edge surface at an end thereof in a longitudinal direction;
an optical waveguide formed on the semiconductor substrate so as to extend in the longitudinal direction;
a non-waveguide region formed on the semiconductor substrate between the optical waveguide and the substrate edge surface; and
an insulation region disposed around the optical waveguide and having a semiconductor interface surface that is an interface between the insulation region and the semiconductor substrate, and is formed at an end thereof in the longitudinal direction so as to be opposite of the substrate edge surface, said semiconductor interface surface extending outwardly away from the optical waveguide and being inclined relative to the substrate edge surface by a specific angle,
wherein said optical waveguide has a center axis extending in a direction inclined relative to the substrate edge surface, and
said semiconductor interface surface is situated away from the substrate edge surface by a distance increasing as the semiconductor interface surface extends away from the optical waveguide.

2. The semiconductor optical function device according to claim 1, wherein said optical waveguide is arranged so that light is completely reflected on the substrate edge surface.

3. The semiconductor optical function device according to claim 1, wherein said optical waveguide includes a bend portion at an end portion thereof.

4. The semiconductor optical function device according to claim 1, further comprising a semiconductor optical function element formed on the optical waveguide.

* * * * *